(12) United States Patent
Frederick et al.

(10) Patent No.: US 7,636,011 B2
(45) Date of Patent: Dec. 22, 2009

(54) CONTROLLER FOR ORING FIELD EFFECT TRANSISTOR

(75) Inventors: Bruce A. Frederick, Plymouth, MN (US); Daryl Weispfennig, Chanhassen, MN (US)

(73) Assignee: Artesyn Technologies, Inc., Carlsbad, CA (US)

(*) Notice: Subject to any disclaimer, the term of this patent is extended or adjusted under 35 U.S.C. 154(b) by 0 days.

(21) Appl. No.: 11/493,992

(22) Filed: Jul. 27, 2006

(65) Prior Publication Data
US 2008/0030263 A1    Feb. 7, 2008

(51) Int. Cl.
*G05F 1/10* (2006.01)
(52) U.S. Cl. .................. 327/541; 327/530; 327/534; 327/538
(58) Field of Classification Search ............ 327/530, 327/534, 535, 537, 538, 540, 541, 543
See application file for complete search history.

(56) References Cited

U.S. PATENT DOCUMENTS

| | | | |
|---|---|---|---|
| 5,831,471 A * | 11/1998 | Nakajima et al. | ........... 327/540 |
| 6,060,943 A | 5/2000 | Jansen | |
| 6,225,857 B1 * | 5/2001 | Brokaw | ............ 327/540 |
| 6,301,133 B1 | 10/2001 | Cuadra et al. | |
| 6,469,564 B1 | 10/2002 | Jansen | |
| 6,522,190 B1 | 2/2003 | Malik et al. | |
| 6,594,163 B2 * | 7/2003 | Tsai | ............... 363/50 |
| 6,919,758 B1 * | 7/2005 | Preslar et al. | ............ 327/541 |
| 7,038,433 B2 * | 5/2006 | Fan et al. | ............ 323/274 |
| 2002/0039034 A1 | 4/2002 | Kohda | |
| 2005/0253642 A1 | 11/2005 | Chen | |

FOREIGN PATENT DOCUMENTS

| | | |
|---|---|---|
| DE | 3217791 | 11/1983 |
| GB | 2293290 | 3/1996 |
| WO | WO99/53618 | 10/1999 |

OTHER PUBLICATIONS

"Regulating Pulse Width Modulator," datasheet and application notes for 1524, SG2524/SG3524 devices, LinFinity Microelectronics, Mar. 18, 2005.

(Continued)

*Primary Examiner*—Bao Q Vu
(74) *Attorney, Agent, or Firm*—Harness, Dickey & Pierce, P.L.C.

(57) ABSTRACT

An ORing element for use in a power supply and/or power system. The ORing element may include a field effect transistor (FET), a first bi-polar transistor and a second bi-polar transistor. The FET may be electrically connected between an input and an output. The first bipolar transistor may have an emitter electrically connected to the source of the FET and a collector electrically connected to a gate of the FET. The second bi-polar transistor may be diode connected, with its emitter electrically connected to its base. The emitter of the second bi-polar transistor may also be electrically connected to the base of the first bi-polar transistor. The collector of the second bi-polar transistor may be electrically connected to the drain of the FET.

17 Claims, 2 Drawing Sheets

OTHER PUBLICATIONS

"Influence of the doping profile on the collector junction breakdown voltages in planar n-p-n transistors," N.A. Samoilov, A.N. Frolov and S.V. Shutov; Technical Physics, vol. 43, No. 10; Oct. 1998; pp. 1262-1263.

"Equivalent doping profile transformation: A semi-empirical analytical method for predicting breakdown characteristics of an approximate single-diffused parallel-plane junction," J. He, X. Shang and Y. Wang; IEEE Transactions on Electron Devices, vol. 48, No. 12; Dec. 2001; pp. 2763-2768.

* cited by examiner

CONTROLLER FOR ORING FIELD EFFECT TRANSISTOR

BACKGROUND

The structure of many electrical power systems includes multiple power modules joined in parallel by a common power bus. ORing circuit elements are typically included between the power supply module's output and the power bus to prevent a failure of one power supply module from drawing down the power bus and leading to a complete failure of the power system. There are several common ORing element designs, each having certain disadvantages.

One common ORing element is a simple diode placed in series between a power supply module's output and the power bus. When the output voltage of the power supply module is sufficiently greater than the voltage at the power bus, the diode is forward-biased, allowing current to flow from the power supply module to the power bus. If, however, the output of the power supply module drops below the output of the power bus, then the diode will be reverse biased. When the diode is reverse biased, the power supply module is essentially prevented from drawing reverse current from the power bus, thereby preventing a potential failure of the power system.

An ideal diode would be an ideal ORing element but real diodes have significant forward drop voltages and for many applications the associated power dissipation makes the use of simple diodes unattractive. Accordingly, it has become common practice to use one or more field effect transistors (FETs) as the ORing element in some applications. One FET or multiple FETs are chosen based on some combination of criteria, voltage rating, cost, size, etc., with sufficiently low on-resistance to result in acceptable power dissipation under appropriate conditions of output current.

Another common ORing element design includes a FET or FETs controlled by a comparator circuit. The comparator circuit senses the difference between the output voltage of the power supply module and the voltage at the power bus, and turns the FET on or off accordingly. That is, when the voltage difference between the power supply module and the power bus is greater than a threshold voltage the FET(s) is (are) turned on. The output current is then allowed to flow from the power supply module to the power bus with a voltage drop essentially equal to the product of the magnitude of the output current and the on-resistance of the FET (or effective resistance of paralleled FETs). When the voltage difference is less than the threshold voltage, the FET is biased off.

Comparator circuits used to control FET-based ORing elements have disadvantages that stem from the fact that real comparators have finite offset voltages associated with their input circuitry. The offset voltage means that there will always be some error in setting (or determining) the threshold voltage at which the control function will turn the FET on or off. If the threshold is positive the comparator could oscillate between on and off for some sufficiently low output current and cause a step voltage on the power bus. For this reason comparator based ORing control circuits typically are designed to have a small but always negative threshold. If the threshold is negative a significant reverse current, from the power bus to the power supply, will be allowed to flow before the voltage drop is high enough in this reverse direction to trip the threshold an cause the FET(s) to be shut off.

As an example, the typical threshold for commercially available ORing FET integrated circuits is −10 milli-volts. In a typical system that employs 100 A power supplies (or power supply modules) the paralleled ORing FET resistance might be 500 micro Ohms or less. A reverse voltage of −10 milli-volts would correspond to the undesirable situation of at least 20 amps of current flowing from the power bus to the power supply before the FETs are turned off.

BRIEF SUMMARY OF THE INVENTION

In one general aspect, the present invention is directed to an ORing element for use in a power supply. The ORing element may include a field effect transistor (FET), a first bi-polar transistor and a second bi-polar transistor. The FET may be electrically connected between an output of the power supply module and a power bus. The first bipolar transistor may have an emitter electrically connected to the source of the FET and a collector electrically connected to a gate of the FET. The second bi-polar transistor may be diode connected, with its emitter electrically connected to its base. The emitter of the second bi-polar transistor may also be electrically connected to the base of the first bi-polar transistor. The collector of the second bi-polar transistor may be electrically connected to the drain of the FET. In this way, the ORing circuit may selectively connect and isolate the power supply module from the power bus. In addition, multiple power supply modules and ORing elements may be combined to form a single power system.

BRIEF DESCRIPTION OF THE FIGURES

Embodiments of the present invention are described herein, by way of example, in conjunction with the following figures, wherein.

DETAILED DESCRIPTION OF THE INVENTION

Figure 1:
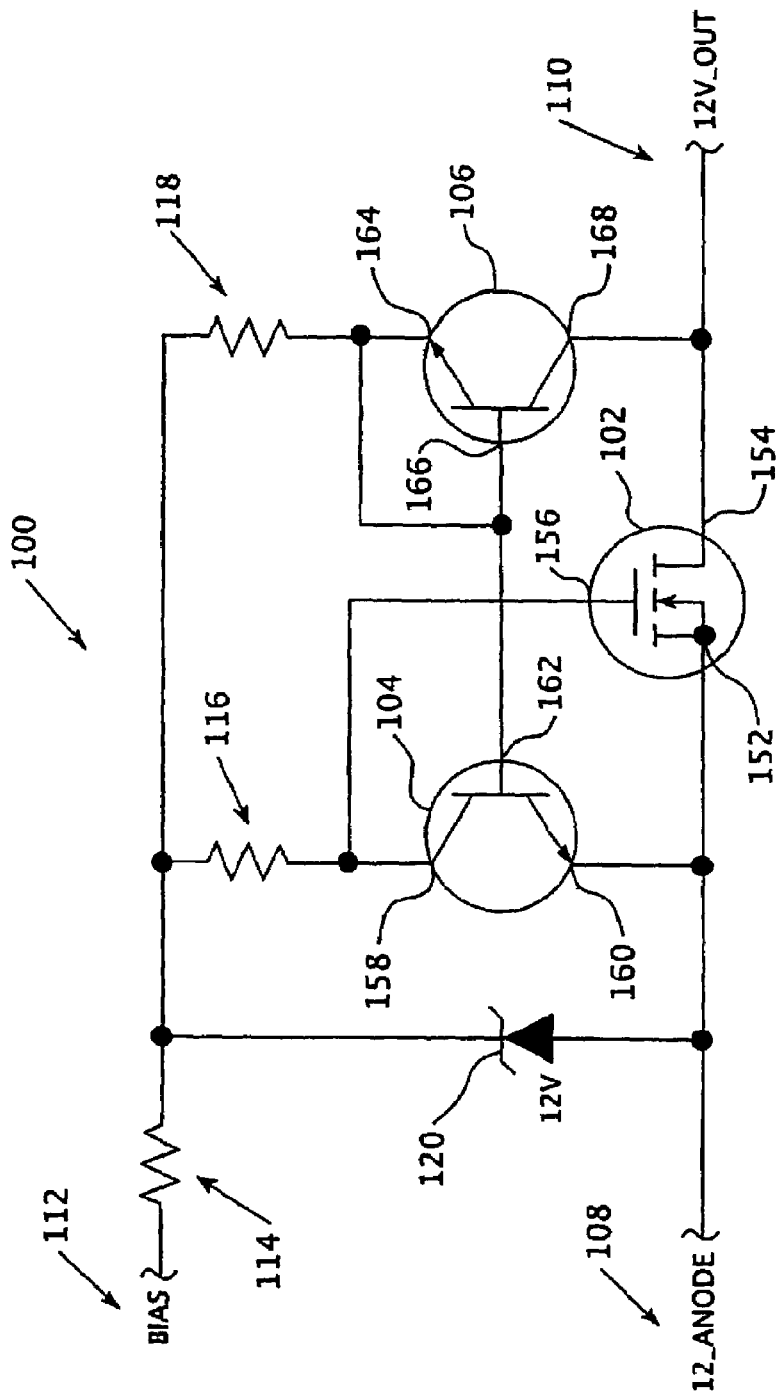
FIG. 1 shows a schematic diagram of an ORing element according to various embodiments.

Embodiments of the present invention are directed in general to ORing circuit elements and power supplies implementing the same. FIG. 1 shows a schematic diagram of an exemplary ORing circuit element 100 according to various embodiments of the present invention. The circuit element 100 has an input node 108 for receiving a voltage provided by a power supply module (not shown in FIG. 1) and an output node 110 for providing a voltage to a power bus (not shown in FIG. 1). The circuit element 100 may also have a bias node 112 that receives a bias voltage. The circuit element 100 includes a field effect transistor (FET) 102, which may be electrically connected between the input node 108 and the output node 110. For example, as shown in FIG. 1, the source terminal 152 of the FET 102 may be coupled to the input node 108 and the drain terminal 154 may be coupled to the output node 110. In this way, the current between the input node 108 and the output node 110 may be controlled by changing the state of the FET 102. For example, when the FET 102 is biased to an on condition, current may flow from the input node 108 to the output node 110. When the FET 102 is not biased to an on condition, the current may be limited and/or prevented altogether.

The ORing circuit element 100 may also include various components for selectively biasing the FET 102 including, for example, bi-polar transistors 104 and 106. The transistor 104 may be connected such that its collector terminal 158 is coupled to the gate terminal 156 of the FET 102. The emitter 160 of transistor 104 is coupled to the source terminal 152 of the FET 102. The transistor 106 may be connected such that its emitter 164 is shorted to its base 166. In this way, the transistor 106 may act as a two terminal device having characteristics similar to a diode (e.g., "diode connected"). The emitter 164 and base 166 of transistor 106 may be coupled to the base 162 of the transistor 104. The collector 168 of the transistor 106 may be coupled to the drain 154 of the FET 102.

In various embodiments, the transistors 104, 106 may be biased by bias currents. For example, a first bias current may be provided at the collector 158 of transistor 104 and a second bias current may be provided at the emitter 164 of the transistor 106. In various embodiments, the respective bias currents may be generated by providing a bias voltage at resistors 116 and 118, connected to the collector 158 of transistor 104 and the emitter 164 of the transistor 106, respectively. In the non-limiting embodiment shown in FIG. 1, the bias voltage is provided to resistors 116, 118 by a bias voltage source 112 and regulated with respect to the source 152 of the FET 102 by zener diode 120 and resistor 114. It will be appreciated that the biasing components 112, 114, 116, 118 are shown for exemplary purposes only, and that bias currents may be provided to the transistors 104, 106 using any suitable circuit components or combinations thereof.

In operation, the FET 102 is selectively biased based on the difference between the input voltage 108 and the output voltage 110. When the output 110 is higher than the input 108, then the FET 102 is held in its off state, isolating the output 110 from any power supply modules and/or other components electrically connected to the input 108. This may be desirable, as a fall in the input voltage 108 relative to the output voltage 110 may indicate a failure of the power supply module or other component electrically connected to the input 108. When the output 110 is lower than the input 108, then the FET 102 may be biased to an active mode or fully on, allowing current to flow between the input 108 and the output 110.

When the output 110 is sufficiently higher than the input 108, the body diode of the FET 102 will be reverse biased. The diode-connected transistor 106 may also be reverse biased due to the relatively high voltage at 110. It will be appreciated that because the transistor 106 is diode-connected across base-collector junction, it may be capable of sustaining higher reverse bias voltages than other diode-connected configurations. In various embodiments, this may make the circuit 100 useful in power supply applications, wherein the reverse bias voltage across transistor 106 may be quite large. The transistor 104 may be in its saturation mode, with its base-collector and base-emitter junctions both forward biased. This results in a relatively low collector voltage for the transistor 104, which keeps the voltage at the gate 156 of the FET 102 at a relatively low level, maintaining the FET 102 in an off state.

When the input 108 begins to rise relative to the output 110, the body diode of the FET 102 may become slightly forward biased. The diode-connected transistor 106 may also become forward-biased and may begin to draw base current from the transistor 104. This, in turn, may draw the transistor 104 out of saturation, reducing its collector current and increasing the collector voltage. As the collector voltage increases at the collector 158 of the transistor 104, the voltage at the gate 156 of the FET 102 begins to rise, transitioning the FET 102 into an active mode when the gate threshold voltage is reached. In various embodiments, the gate threshold voltage is reached while the current at the output 110 is relatively low (e.g., less than 100 mA) and low body diode bias voltages (e.g., less than 10 mV). As the current at output 110 increases further, the on resistance of the FET 102 may become dominant, causing the voltage drop across the FET 102 as well as the gate 156 voltage of the FET 102 to increase more quickly. Accordingly, the FET 102 may eventually transition to a fully on state. In operation the circuit is functionally different from comparator circuits in that the gate-source voltage 156-152 of FET 102 has a proportional relationship to the output current at 110 rather than the simple on-or-off of comparator based circuits.

The lowest voltage drop between input 108 and output 110 (e.g., the voltage drop across the FET 102) at which the FET 102 is biased on may be referred to as the "threshold voltage" of the circuit 100. It will be appreciated that because the forward bias voltage of diode-connected transistor 104 will more closely match the base-emitter voltage of transistor 106 than would a simple diode, the circuit 100 may achieve more repeatable and lower threshold voltages. To potentially further enhance the repeatability of the circuit element 100, the transistors 104 and 106 may be contained in a single package, for example, a 6-pin SOT-23 package such as part number ZXTD09N50DE6 available from ZETEX. In this way, the transistors 104 and 106 may thermally track each other, further causing them to behave similarly.

It will be appreciated that when the current at the output 110 is relatively low, then the FET 102 will operate in its active state. In that state, the FET 102 behaves in a non-Ohmic manner (e.g., its dynamic impedance is higher than a static calculation of Ohm's law would suggest). As a result, small changes in current at the output 110 may tend to cause large changes in the voltage drop across the FET 102. Accordingly, even if the components of the ORing circuit element 100 would ordinarily result in a negative threshold voltage, reverse current is still limited. Because close to the threshold, small changes in output current can bring about large changes in the voltage drop across the FET 102, if the current at the output 110 begins to turn negative, it will bring about a large change in the voltage drop across the FET. This may cause the transistors 104, 106 to draw the gate 156 of the FET 102 low and prevent substantial negative output current.

Figure 2:
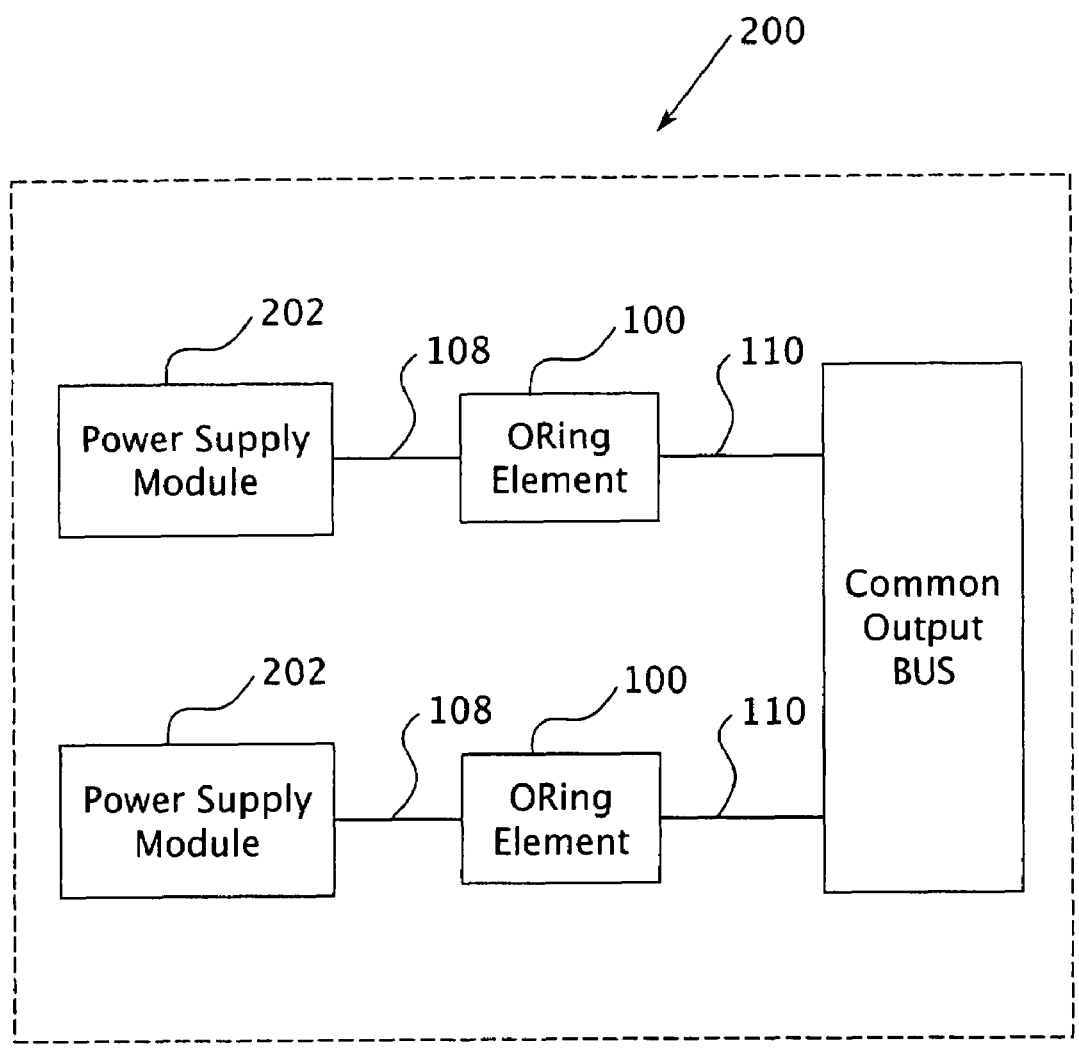
FIG. 2 shows a block diagram of a power system according to various embodiments.

FIG. 2 shows a block diagram according to various embodiments of an exemplary power system 200. The power system includes multiple power supply modules 202. Each power supply module 202 is electrically connected to a power bus 204 via ORing elements 100 that may be similar or identical to the ORing elements 100 described above. The inputs 108 of the ORing elements 100 are connected to their respective power supply modules 202, while the outputs 110 of the ORing elements 100 are connected to the power bus 204. In this way, the ORing elements may provide a buffer between the respective power supply modules 202 and the power bus 204 as described above. It will be appreciated that the number of power supply modules 202 and ORing elements 100 may vary depending on the particular application.

In operation, when the various power supply modules 202 are operating properly, they may provide a voltage at input 108 that is, at least slightly, higher than the voltage at output 110 and the power bus 204. Accordingly, the FET's 102 (not shown in FIG. 2) of the respective ORing elements 100 are in an active or saturation state, allowing forward current between the power supply modules 202 and the power bus 204. If a power supply module 202 fails, then it may draw the input 108 of its corresponding ORing element 100 low. As a result, the FET 102 of the ORing element will be transitioned to an off state, preventing the failed power supply module 202 from drawing down the voltage at the power bus 204.

As used herein, the term, "power system" refers to any electrical power architecture, including stand-alone power supplies, combinations of power supplies, etc. Also, as used herein, the term, "power supply module" or "module" refers to any kind of sourcing function; power supply, power converter, power conditioner, power regulator, voltage regulator, current source, battery, generator, transformer, etc.)

It is to be understood that the figures and descriptions of the present invention have been simplified to illustrate elements that are relevant for a clear understanding of the present invention, while eliminating, for purposes of clarity, other elements, such as, for example, some specific terms of the instruments described above, etc. Those of ordinary skill in the art will recognize that these and other elements may be desirable. However, because such elements are well known in the art and because they do not facilitate a better understanding of the present invention, a discussion of such elements is not provided herein.

While several embodiments of the invention have been described, it should be apparent that various modifications, alterations and adaptations to those embodiments may occur to persons skilled in the art with the attainment of some or all of the advantages of the present invention. For example, the values of various components may be varied. Also various components (e.g., resistors, filtering capacitors, etc.) may be added or removed to the circuits. The present description is therefore intended to cover all such modifications, alterations and adaptations without departing from the scope and spirit of the present invention as defined by the appended claims.

We claim:

1. An ORing element for use in a power supply, the ORing element comprising:
    a field effect transistor (FET) for electrical connection between an output of the power supply and a bus;
    a first bi-polar transistor, wherein an emitter of the first bi-polar transistor is electrically connected to a source of the FET, and wherein a collector of the first bi-polar transistor is electrically connected to a gate of the FET; and
    a second bi-polar transistor, wherein an emitter of the second bi-polar transistor is electrically connected to a base of the second bi-polar transistor and a base of the first bi-polar transistor, and wherein a collector of the second bi-polar transistor is electrically connected to a drain of the FET.

2. The ORing element of claim 1, wherein the collector of the first bi-polar transistor is electrically connected to a first bias current.

3. The ORing element of claim 2 further comprising a bias voltage and a first resistor connected to the collector of the first bi-polar transistor, the bias voltage coupled to the first resistor for generating the first bias current.

4. The ORing element of claim 3, wherein the emitter of the second bi-polar transistor is electrically connected to a second bias current.

5. The ORing element of claim 4 further comprising a second resistor connected to the emitter of the second bi-polar transistor, the bias voltage coupled to the second resistor for generating the second bias current.

6. The ORing element of claim 5 further comprising a zener diode electrically connected between the bias voltage and the source of the FET.

7. The ORing element of claim 1, wherein the first bi-polar transistor and the second bi-polar transistor are contained in a single package.

8. The ORing element of claim 7, wherein the single package is a 6-pin SOT-23 package.

9. A power system comprising:
    a first power supply module;
    a common power bus; and
    an ORing element connected between the first power supply module and the common power bus, wherein the ORing element comprises:
        a field effect transistor (FET) electrically connected between the first power supply module and the common power bus;
        a first bi-polar transistor, wherein an emitter of the first bi-polar transistor is electrically connected to a source of the FET, and wherein a collector of the first bi-polar transistor is electrically connected to a gate of the FET; and
        a second bi-polar transistor, wherein an emitter of the second bi-polar transistor is electrically connected to a base of the second bi-polar transistor and a base of the first bi-polar transistor, and wherein a collector of the second bi-polar transistor is electrically connected to a drain of the FET.

10. The power system of claim 9, wherein the collector of the first bi-polar transistor is electrically connected to a first bias current.

11. The ORing element of claim 10 further comprising a bias voltage and a first resistor connected to the collector of the first bi-polar transistor, the bias voltage coupled to the first resistor for generating the first bias current.

12. The power system of claim 11, wherein the emitter of the second bi-polar transistor is electrically connected to a second bias current.

13. The ORing element of claim 12 further comprising a second resistor connected to the emitter of the second bi-polar transistor, the bias voltage coupled to the second resistor for generating the second bias current.

14. The ORing element of claim 13 further comprising a zener diode electrically connected between the bias voltage and the source of the FET.

15. The power system of claim 9, wherein the first bi-polar transistor and the second bi-polar transistor are contained in a single package.

16. The power system of claim 15, wherein the single package is a 6-pin SOT-23 package.

17. The power system of claim 9, further comprising a second power supply module; and a second ORing element connected between the second power supply module and the common power bus.

* * * * *